(12) United States Patent
Modavis et al.

(10) Patent No.: US 9,933,587 B2
(45) Date of Patent: Apr. 3, 2018

(54) OLEDS WITH IMPROVED LIGHT EXTRACTION USING ENHANCED GUIDED MODE COUPLING

(71) Applicant: CORNING INCORPORATED, Corning, NY (US)

(72) Inventors: Robert Adam Modavis, Painted Post, NY (US); Daniel Aloysius Nolan, Corning, NY (US); Mark Alejandro Quesada, Horseheads, NY (US); Wageesha Senaratne, Horseheads, NY (US); Dean Michael Thelen, Addison, NY (US)

(73) Assignee: Corning Incorporated, Corning, NY (US)

( * ) Notice: Subject to any disclaimer, the term of this patent is extended or adjusted under 35 U.S.C. 154(b) by 91 days.

(21) Appl. No.: 14/920,169

(22) Filed: Oct. 22, 2015

(65) Prior Publication Data

US 2016/0116696 A1    Apr. 28, 2016

Related U.S. Application Data

(60) Provisional application No. 62/068,190, filed on Oct. 24, 2014.

(51) Int. Cl.
*G02B 6/42*    (2006.01)
*H01L 51/52*    (2006.01)
*G02B 6/12*    (2006.01)

(52) U.S. Cl.
CPC ....... *G02B 6/4298* (2013.01); *G02B 6/12004* (2013.01); *H01L 51/5262* (2013.01); *H01L 51/5268* (2013.01)

(58) Field of Classification Search
CPC .............. G02B 6/4298; G02B 6/12004; H01L 2251/5338; H01L 2251/5361
See application file for complete search history.

(56) References Cited

U.S. PATENT DOCUMENTS 6,930,321 B2    8/2005    Guenther et al.
8,486,753 B2    7/2013    Park et al.
(Continued)

FOREIGN PATENT DOCUMENTS

CN    103390727    11/2013
CN    104282844    1/2015

OTHER PUBLICATIONS

Bocksrocker et al; "White organic light emitting diodes with enhanced internal and external outcoupling for ultra-efficient light extraction and Lambertian emission"; Optics Express, vol. 20, No. 56, 2012 A932-A940.
(Continued)

*Primary Examiner* — Thomas A Hollweg
*Assistant Examiner* — Mary A El Shammaa

(57) ABSTRACT

An organic light emitting diode (OLED) device having enhanced light extraction is disclosed. The OLED device includes an upper waveguide structure having an organic layer and supports first guided modes, and a lower waveguide structure with a light-extraction waveguide that supports second guided modes substantially matched to the first guided modes. The lower waveguide structure includes a light-extraction waveguide interfaced with a light-extraction matrix. The light-extraction waveguide includes one or more light-redirecting features. The upper and lower waveguide structures are configured to facilitate mode coupling from the first guided modes to the second guide modes while substantially avoiding coupling the first guided modes to surface plasmon polaritons. The light traveling in the second guided modes is redirected to exit the OLED device by light-redirecting features of the light-extraction waveguide.

17 Claims, 6 Drawing Sheets

(56) References Cited

U.S. PATENT DOCUMENTS

| | | |
|---|---|---|
| 8,981,640 B2 | 3/2015 | Levermore et al. |
| 8,981,643 B2 | 3/2015 | Wang et al. |
| 2005/0285518 A1 | 12/2005 | Cok |
| 2007/0077349 A1 | 4/2007 | Newman et al. |
| 2008/0303435 A1 | 12/2008 | Cok |
| 2010/0060142 A1 | 3/2010 | Itou et al. |
| 2011/0024779 A1 | 2/2011 | Nakamura et al. |
| 2011/0169027 A1 | 7/2011 | Park et al. |
| 2013/0037787 A1 | 2/2013 | Stromer et al. |
| 2013/0105770 A1* | 5/2013 | Pschenitzka ........ H01L 31/0232 257/40 |
| 2013/0228801 A1 | 9/2013 | Lee |
| 2014/0091292 A1 | 4/2014 | Baker et al. |
| 2014/0139410 A1* | 5/2014 | Peeters ................. H01L 51/447 345/77 |
| 2014/0167085 A1 | 6/2014 | Lee et al. |
| 2015/0008401 A1 | 1/2015 | Lee et al. |
| 2015/0008415 A1 | 1/2015 | Schwab |
| 2015/0014643 A1 | 1/2015 | Lee et al. |
| 2015/0228929 A1 | 8/2015 | Lamansky et al. |
| 2015/0311474 A1 | 10/2015 | Basil et al. |

OTHER PUBLICATIONS

PCT/US2015/056822 Search Report dated Jan. 28, 2016.
Pavicic et al. "Efficient White PIN OLED Structures with Internal and External Light Outcoupling Enhancement" LIT1/OLE1-2 Invited Paper. pp. 459-462. 2011.
Vandersteegen et al. "Employing a 2D surface grating to improve light out coupling of a substrate emitting organic LED" Proc. of SPIE vol. 6486, 8 pgs. 2007.

* cited by examiner

OLEDS WITH IMPROVED LIGHT EXTRACTION USING ENHANCED GUIDED MODE COUPLING

CROSS-REFERENCE TO RELATED APPLICATIONS

This application claims the benefit of priority under 35 U.S.C. § 119 of U.S. Provisional Application Ser. No. 62/068,190 filed on Oct. 24, 2014 the content of which is related to patent application Ser. No. 14/041,359 filed on Sep. 20, 2013, the content of which is relied upon and incorporated herein by reference in its entirety.

FIELD

The present disclosure relates to organic light emitting diodes (OLEDs) and in particular to OLEDs with improved light extraction using enhanced guided mode coupling.

BACKGROUND

An OLED is a type of light-emitting diode that relies on electroluminescence of an organic material (film) when subjected to an electric current from electrodes arranged on either side of the organic material. Because of their excellent light-emitting properties, OLEDs are attractive as light sources for a variety of display applications ranging from smart phones to large outdoor displays.

As with other types of LEDs, a continual challenge with OLEDs is optimizing light extraction. Consequently, a variety of OLED configurations have been proposed, including those described in the '359 application, to increase light extraction efficiency and enhance other performance parameters of OLEDs.

Nevertheless, there is a continuing need to keep improving the light extraction from OLEDs to further enhance their performance.

SUMMARY

An aspect of the disclosure is an OLED device having enhanced light extraction, including: an upper waveguide structure that supports first guided modes and comprising a cathode, an anode with a lower surface, and an organic light-emitting semiconductor material interposed between the cathode and the anode; a lower waveguide structure interfaced with the upper waveguide structure and that supports second guided modes substantially matched to the first guided modes, the lower waveguide structure comprising a substrate having an upper surface, a light-extraction waveguide distributed over an upper surface of the substrate, and a light-extraction matrix distributed over the light-extraction waveguide and the upper surface of the substrate; wherein the light-extraction matrix includes a rough upper surface that interfaces with the lower surface of the anode and that facilitates mode coupling from the first guided modes of the upper waveguide structure to the second guide modes of the lower waveguide structure while substantially avoiding coupling from the first guided modes to surface plasmon polaritons; and wherein light traveling as second guided modes in the light-extraction waveguide of the lower waveguide structure is redirected to exit the lower surface of the substrate by light-redirecting features of the lower waveguide structure.

Another aspect of the disclosure is the OLED device described above, wherein the light-extraction waveguide includes discrete waveguide elements.

Another aspect of the disclosure is the OLED device described above, wherein no greater than 50% of light carried in the first guided modes is coupled into the surface plasmon polaritons.

Another aspect of the disclosure is the OLED device described above, wherein the rough upper surface has a periodic component with a peak-to-valley amplitude A and a period P, wherein 0.5 µm≤P≤2 µm, and wherein 20 nm A 60 nm.

Another aspect of the disclosure is the OLED device described above, wherein the rough upper surface has a random component defined by a root-mean-square (RMS) surface roughness $\sigma_{33}$, wherein 5 nm≤$\sigma_{33}$≤25 nm.

Another aspect of the disclosure is the OLED device described above, wherein the light-extraction waveguide is formed from an agglomerated nanoparticle coating.

Another aspect of the disclosure is the OLED device described above, wherein the agglomerated nanoparticle coating includes at least one of: titania rutile, anatase, zirconia, yttria-stabilized zirconia, alumina, tin oxide, cerium oxide, zinc oxide, and mixtures of these with silica.

Another aspect of the disclosure is the OLED device described above, wherein the light-extraction waveguide includes continuous waveguide elements that have light-redirecting features.

Another aspect of the disclosure is the OLED device described above, wherein the light-extraction waveguide includes light-redirecting features in the form of surface roughness and internal voids.

Another aspect of the disclosure is an OLED device having enhanced light extraction. The OLED device includes: an upper waveguide structure having an organic layer and configured to support first guided modes; and a lower waveguide structure with a light-extraction waveguide configured to support second guided modes substantially matched to the first guided modes, wherein the light-extraction waveguide is interfaced with a light-extraction matrix configured to facilitate mode coupling from the first guided modes to the second guide modes while substantially avoiding coupling the first guided modes to surface plasmon polaritons; and wherein the light-extracting waveguide includes light-redirecting features that redirects light traveling in the light-extracting waveguide as the second guided modes to exit the lower waveguide structure.

Another aspect of the disclosure is the OLED device described above, wherein the light-extraction waveguide includes discrete waveguide elements.

Another aspect of the disclosure is the OLED device described above, wherein the light-extraction waveguide is formed from an agglomerated nanoparticle coating.

Another aspect of the disclosure is the OLED device described above, wherein the agglomerated nanoparticle coating includes at least one of: titania, rutile, anatase, zirconia, yttria-stabilized zirconia, alumina, tin oxide, cerium oxide, zinc oxide, and mixtures of these with silica.

Another aspect of the disclosure is a method of extracting light from an organic light-emitting diode (OLED) device in an enhanced manner. The method includes: guiding light emitted by a layer of organic material in first guided modes of an upper waveguide structure formed by the layer of organic material interposed between an anode and a cathode; optically coupling the light in the first guided modes into light that travels in second guided modes of a lower waveguide structure having a lower surface and that includes a light-extraction waveguide having a varying thickness and interfaced with a light-extraction matrix having a first rough surface that interfaces with the anode of the upper waveguide, wherein the rough surface is configured to enhance the coupling of the light in the first guided modes into the light traveling in the second guided modes within the light-extraction waveguide while substantially avoiding coupling the first guided modes to surface plasmon polaritons; and redirecting the light traveling in the light-extraction waveguide out of the lower surface of the lower waveguide structure.

Another aspect of the disclosure is the method described above, wherein the redirection of the light traveling in the light-extraction waveguide in the second guided modes is caused by scattering from one or more light-redirecting features.

Another aspect of the disclosure is the method described above, wherein the one or more light-redirecting features includes voids within a body of the light-extraction waveguide and a rough surface of the light-extraction waveguide.

Another aspect of the disclosure is the method described above, wherein the light-extraction waveguide includes discrete waveguide elements.

Another aspect of the disclosure is the method described above, wherein no greater than 50% of the light of the first guided modes is coupled into the surface plasmon polaritons supported at the interface between the rough surface of the light-extraction matrix and the anode.

Another aspect of the disclosure is the method described above, wherein the rough upper surface has a periodic component and a random component, with the periodic component having a peak-to-valley amplitude A and period P, wherein $0.5$ µm$\leq$P$\leq$2 µm and 20 nm$\leq$A$\leq$60 nm, and wherein the random component is defined by a root-mean-square (RMS) surface roughness $\sigma_{33}$, wherein 5 nm$\leq\sigma_{33}\leq$25 nm.

Another aspect of the disclosure is the method described above, wherein the light-extraction waveguide is formed from an agglomerated nanoparticle coating that includes at least one of: titania rutile, anatase, zirconia, yttria-stabilized zirconia, alumina, tin oxide, cerium oxide, zinc oxide, and mixtures of these with silica.

BRIEF DESCRIPTION OF THE DRAWINGS

The following detailed description of specific embodiments of the present disclosure can be best understood when read in conjunction with the following drawings, where like structure is indicated with like reference numerals.

DETAILED DESCRIPTION

In the description below, the terms "interfaced" and "interfaces" used in connection with two items (e.g., two surfaces, two layers, two structures, etc.) A and B being "interfaced" or A "interfaces" B, means that the items A and B are disposed immediately adjacent one another or are otherwise arranged to be in contact with each other.

Figure 1A:
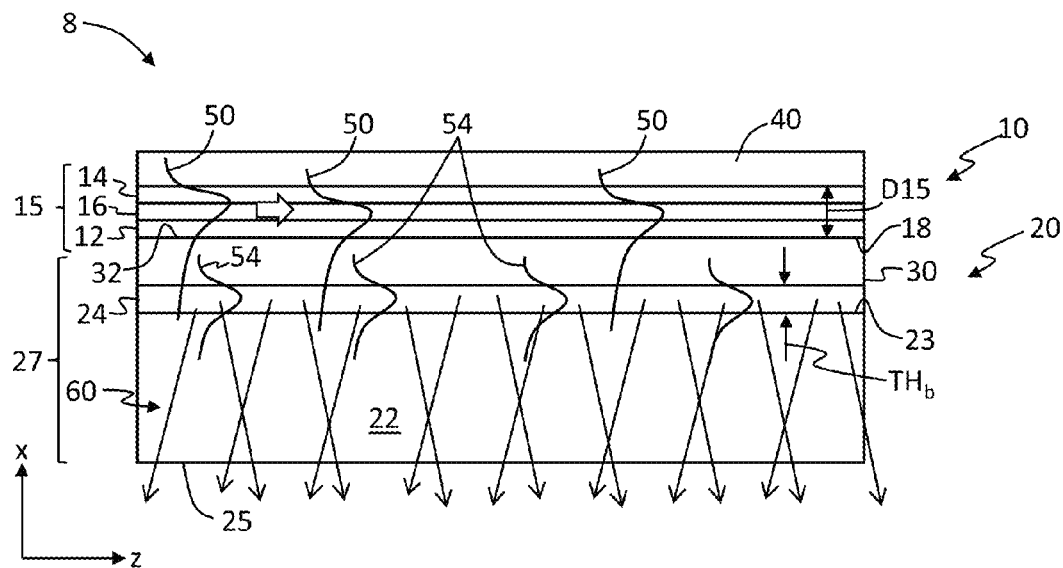
FIG. 1A is a cross-sectional view of the layered structure of an example OLED device according to one embodiment of the present disclosure.
Figure 1B:
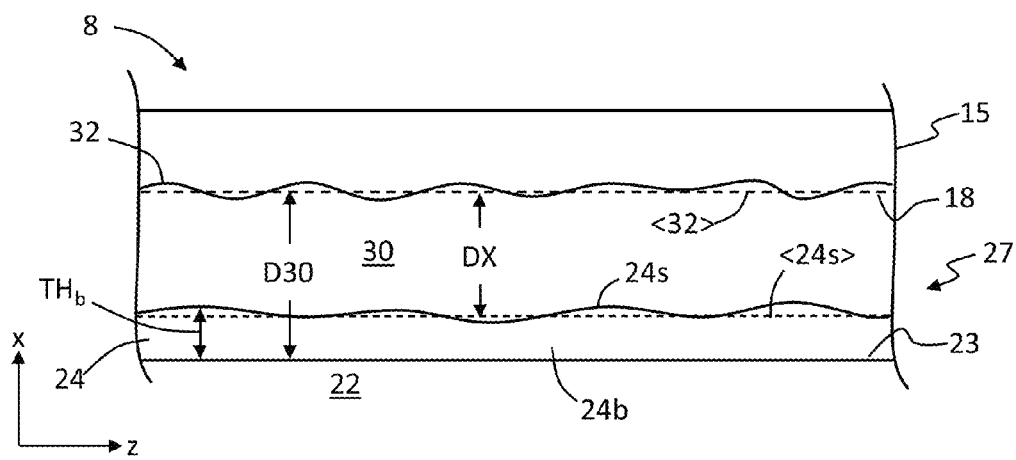
FIG. 1B is a close-up, cross-sectional view of a central portion of the OLED device according FIG. 1 showing an example light-extraction waveguide and the light-extraction matrix.

FIG. 1A is cross-sectional view of an example OLED 8 according to an embodiment of the disclosure. FIG. 1B is a close-up, cross-sectional view of a central portion of the OLED structure. The OLED 8 includes a diode superstructure 10 and a light-extraction substructure 20. The diode superstructure 10 comprises an anode 12, a cathode 14, and an organic light-emitting semiconductor material layer ("organic layer") 16 interposed between the anode 12 and the cathode 14. The anode 12, cathode 14 and organic layer 16 define an upper waveguide structure 15 that has a lower surface 18 defined by the lower surface of anode 12. The upper waveguide structure 15 has a thickness D15, which in one example, D15<1.0 µm, while in another example, 0.1 µm <D15<0.6 µm.

In an example embodiment, the anode 12 of upper waveguide structure 15 is made of a transparent conductive oxide, such as indium tin oxide (ITO), that is transparent to visible-wavelength light emitted by organic layer 16. As noted above, the lower surface 18 of anode 12 provides a suitable interface with the upper surface of a light-extraction matrix of the light extraction substructure, as described below. The cathode 14 may comprise any conductive material that has the appropriate work function to match the light-emitting material of organic layer 16. For example, the cathode 14 may comprise Ag, Au, Al, SM, Tm, Yb or bimetallic materials, such as Ca:Al, Eu:Yb, or Tm:Yb. The thickness of cathode 14 may be in the range of about 70 to 400 nm, or about 70 to 300 nm, or about 70 to 200 nm.

In some cases, when the cathode 14 has a thickness is below 70 nm, the OLED device 8 may become bi-directional, as light emitted from organic layer 16 can escape through the cathode as well as through the anode 12. This may be advantageous under certain circumstances where additional components are used to harvest the light escaping from the cathode. Therefore, some embodiments of OLED device 8 can include cathode 14 having a thickness of from about 10 nm to about 70 nm, less than about 70 nm, or a thickness such that more than greater than 1% of the light 60 emitted from the OLED is emitted through the cathode.

The light-extraction substructure 20 comprises a substrate 22 having an upper surface 23, a bottom or lower surface 25, and a light-extraction waveguide 24 formed on the upper surface of the substrate, and a light-extraction matrix 30 interfaced with (e.g., distributed over) the light-extraction waveguide. The light-extraction matrix 30 has an upper surface 32 that interfaces with lower surface 18 of the upper waveguide structure 15. In an example, substrate 22 can comprise chemically strengthened glass, ion-exchanged glass, non-strengthened glass or alkali-free glass. The substrate 22, the light-extraction matrix 30 and the light-extraction waveguide 24 define a lower waveguide structure 27 that includes one or more types of light-redirecting features, as explained below.

In an example, light-extraction waveguide 24 has a body 24b and an upper surface 24s. In an example, body 24b includes voids 24v and upper surface 24s has an RMS surface roughness $\sigma_{24}$. In an example best seen in FIG. 1B, body 24b varies in thickness $TH_b$ so that upper surface 24s also varies in the x-direction as a function of position in the z-direction. The average x-position of upper surface 24s is denoted <24s> and is referred to as the average upper surface. In an example, upper surface 24s has a surface height is defined by a height function $h_{24}(z)$ measured relative to substrate upper surface 23. Also as can be seen in FIG. 1B, light-extraction matrix 30 has a varying surface 32, with the average surface denoted <32>.

The distance in the x-direction separating the average surface <24s> of the light-extraction waveguide 24 and the lower surface 18 of the upper waveguide structure 15 is denoted as DX, which in an example is less than 1 μm.

The OLED 8 may optionally include an encapsulating layer 40 atop the diode superstructure 10.

FIG. 1A shows light 60 being extracted from OLED structure 8 through substrate 22, with the extracted light 60 originating within the body 24b and from the surface 24s of light-extraction waveguide 24, as explained below. In practice, light 60 exits substrate 22 over relatively wide range of angles.

In an example, light-extraction waveguide 24 is arranged sufficiently close to upper waveguide structure 15 (i.e., distance DX is sufficiently small) and is configured to have substantially the same mode structure so that light traveling in the upper waveguide structure can optically couple to the light-extraction waveguide. This light coupling occurs over a coupling length $L_C$. In an example, light-extraction waveguide 24 has a substantially similar effective index of refraction and dimensions to that of upper waveguide structure 15 to ensure that the upper and lower waveguide structures 15 and 27 support substantially the same types of modes (i.e., have substantially the same mode structure). An example of coupled waveguides used for light extraction is disclosed in U.S. Pat. No. 7,432,649, which is incorporated by reference herein.

In another example, the modal volume of the lower waveguide structure 27 supports significantly more modes than does the upper waveguide structure 15. This ensures that there will be modes supported in the lower waveguide structure 27 that match modes supported in the upper waveguide structure 15 as the dimensions or thickness of the lower waveguide structure change due to surface roughness. Generally speaking, the number N of modes in a slab waveguide are approximately given by $N=(\pi d/\lambda)(n_2^2-n_1^2)^{1/2}$, where d is the thickness of a core of the slab waveguide and $n_2$ and $n_1$ are the core and cladding refractive indices, respectively. Accordingly, the number of modes in the lower waveguide structure 27 increases in proportion to the thickness $TH_b$ of the light-extraction layer 24, which better ensures a mode match between the upper and lower waveguide structures 15 and 27. In one example, the thickness $TH_b$ of the light-extraction waveguide 24 is nominally 0.5 microns, in another example $TH_b \leq 1.5$ μm and in another example $TH_b \leq 3$ μm while in another example $TH_b \leq 5$ μm. In an example, the above thicknesses $TH_b$ are averages thickness for the light-extraction waveguide 24 measured with respect to the average surface <24s>.

Figure 2A:
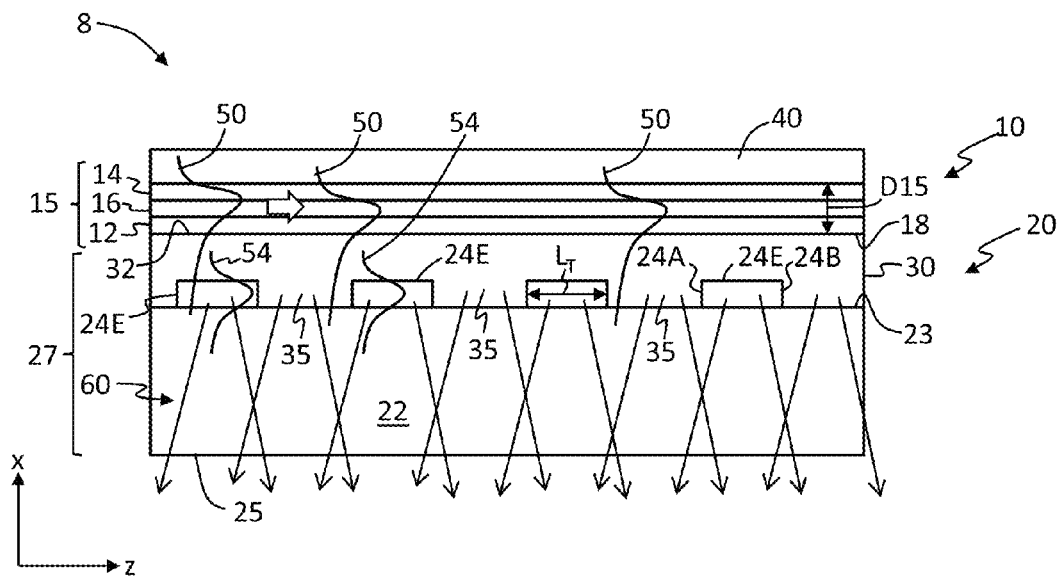
FIG. 2A is similar to FIG. 1A and illustrates an example embodiment wherein the light-extraction waveguide comprises discrete waveguide elements.

FIG. 2A is similar to FIG. 1A and illustrates an example embodiment wherein light-extraction waveguide 24 comprises a plurality of discrete light-extraction waveguide elements ("WG elements") 24E. Light-extraction matrix 30 in this embodiment is also called a "planarization layer" because it is distributed over the discrete WG elements 24E and the upper surface 23 of the substrate and fills in the gaps between the WG elements.

Each WG element 24E has termination points (or ends) 24A and 24B. Each WG element 24E has a length $L_T$ defined by the distance between the termination points 24A and 24B. In some cases, the total amount of space occupied by WG elements 24E in light-extraction matrix 30 may be from about 35% to about 65%. The termination points 24A and 24B of adjacent WG elements 24E define gaps 35 of length LG (the "gap length") that are filled with the material of the light-extraction matrix 30 and define light extraction sites, as explained below.

In an example where DX is about 0.4 μm, the coupling length $L_C$ is about 10 μm or less, and the length $L_T$ of WG elements 24E is approximately 10 μm or more. In an example wherein DX is about 0.3 μm, the coupling length $L_C$ is about 5 μm or less, and the length $L_T$ of the WG elements 24E is approximately 5 μm or more. In an example, DX is selected to be thin enough so that a majority, or substantially all, of the WG elements 24E have a length $L_T \leq 10$ μM.

For maximum light extraction efficiency, the condition $L_T > L_C$ needs to be satisfied. It is also worth noting that the coupling length $L_C$ is mode dependent. The higher-order modes of guided modes 50 of upper waveguide structure 15 couple to the lower waveguide structure 27 over significantly shorter lengths than the lower-order modes. This is because the evanescent fields of the higher-order modes of guide modes 50 extend exponentially farther into the light-extraction layer 30 and into the light-extraction waveguide 24 (or waveguide elements 24E) as compared to the lower-order modes.

This condition can be expressed mathematically as a ratio $R_\beta = \exp(-\beta_h \cdot d)/\exp(-\beta_l \cdot d)$, where $\beta_h$ and $\beta_l$ are the propagation constants of the higher-order and lower-order modes respectively of guided modes 50. This ratio $R_\beta$ can be a very large number. For the highest- and lowest-order modes, the ratio $R_\beta$ is several orders of magnitude. So if the highest-order mode in guided modes 50 couples within a coupling length $L_C$ of 10 microns into the lower waveguide structure 27, the lowest-order modes couple within lengths of millimeters and in some cases centimeters or larger. The roughness on surface 32 of the light-extraction layer 30 allows for the lower-order modes in guided modes 50 of the upper waveguide structure 15 to couple to the higher-order modes 54 of the lower waveguide structure 27.

In an example, a majority, or substantially all, of the WG elements 24E have a length $L_T \leq 10$ μM, and in an example, $L_T \leq 5$ μm. Also in an example, the lower waveguide structure 27 with WG elements 24E can have a substantially similar refractive indices (or effective indices) and substantially similar dimensions to the corresponding layers of upper waveguide structure 15 to ensure that the upper and lower waveguide structures 15 and 27 support substantially the same types of modes (i.e., have substantially the same mode structure). As mentioned above, the lower waveguide structure 27 can also support a significantly greater number of modes 54 than the modes 50 upper waveguide structure 15.

In an example, WG elements 24E are pseudo-random distributed, i.e., have variations in length $L_T$ and gap spacing LG. In an example, the pseudo-random distribution is a random distribution that is controlled via the fabrication process to the extent sufficient to ensure a substantially uniform distribution of WG elements 24E substantially centered on the desired values for the length $L_T$ and spacing LG.

Figure 3:
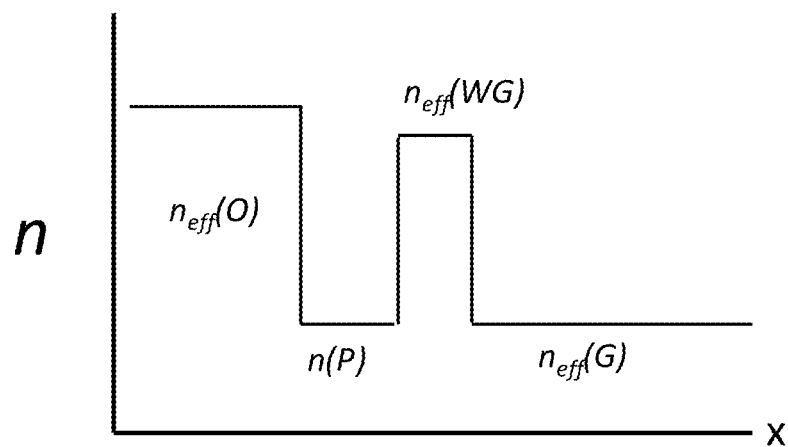
FIG. 3 is a plot of the refractive index n versus x (µm) illustrating an example refractive index profile for the example OLED device of FIG. 1.

FIG. 3 is a plot of refractive index n as a function of distance x for the OLED device 8 and illustrates an example refractive index profile for the OLED device. In example embodiments, enhanced light extraction can be achieved by ensuring that the index of refraction n(P) of the light-extraction matrix 30 is at least approximately 0.2 less than the effective index of refraction $n_{eff}(O)$ of the upper waveguide structure 15 and the effective index of refraction $n_{eff}(WG)$ of the WG elements 24.

In another example, the respective effective indices $n_{eff}(O)$ and $n_{eff}(WG)$ differ by approximately 0.2 or less. In addition, referring to FIG. 1A, the thickness D15 of the upper waveguide structure 15 and the thickness D30 of light-extraction matrix 30 (see FIG. 2B) differ by less than approximately 1.5 μm, or in some embodiments, 1.0 μm. As is noted above, the upper waveguide structure 15 is often separated from light-extraction waveguide 24 by distance DX<1.5 μm, or in some embodiments DX<1.0 μm, or in some embodiments DX<0.5 μm.

In an example, the upper waveguide structure 15 and the lower waveguide structure 27 are configured such that, in operation, light originating in the organic layer 16 of the diode superstructure 10 travels in the upper waveguide structure in the z-direction in guided modes 50 (e.g. 5 or 6 guided modes, including TE and TM modes), which is shown as a single guided mode for ease of illustration. A portion of the guided modes 50 (i.e., the evanescent tails) extend into light-extraction matrix 30 and into light-extraction waveguide 24 residing therein.

As noted above, in an example, light-extraction waveguide 24 (including WG elements 24E in the discrete waveguide embodiment) of lower waveguide structure 27 are substantially matched in refractive index and width to upper waveguide structure 15 so that the guide modes 54 of the lower waveguide structure are substantially matched to the guided modes 50 of the upper waveguide structure. This facilitates efficient mode coupling between the upper and lower waveguide structures 15 and 27. Consequently, some of the light in guided modes 50 is coupled to light-extraction waveguide 24 of the light-extraction substructure 20 and travel therein as guided modes 54, which is shown as a single guided mode for ease of illustration. The evanescent tails of the higher-order modes of guided modes 50 extend farther out from upper waveguide structure 15 and thus interact more strongly with light-extraction matrix 30 of the lower waveguide structure 27, as compared to the evanescent tails of the low-order modes, which are more tightly bound to the organic layer 16 of the upper waveguide structure 15.

The mode coupling between upper and lower waveguide structures 15 and 27 occur over the aforementioned coupling length $L_C$, which is defined as the propagation distance required for an optical mode to be coupled from one waveguide to another. The coupling length $L_C$ is determined by the waveguide geometry, waveguide indices, wavelength, and by the mismatch between the effective refractive indices of the coupled waveguide modes, as is known in the art. The extraction of light 60 from OLED device 8 via mode coupling preferably occurs over a length scale shorter than the absorption length $L_{PA}$ of plasmonic absorption, i.e., $L_C < L_{PA}$.

The guided modes 54 that travel in light-extraction waveguide 24 interact with roughness on the surface 24s and also volumetrically scatter from voids 24v within the body 24b. Thus, some of the extracted light 60 originates as light redirected from light-extraction waveguide 24, with the roughness on surface 24s and the voids 24v in body 24b constituting examples of light-redirecting features of lower waveguide structure 27. In the case where light-extraction waveguide 24 includes discrete WG elements 24E, the light-redirecting features additionally include the terminal ends 24A and 24B of the WG elements 24. Thus, light-redirecting features include surface roughness and voids (or "internal roughness"), refractive-index variations, and material interfaces. The light-redirecting features also include the variations or undulations in thickness $TH_b$ of the body of light-extraction waveguide 24. Such undulations or variations cause leakage of the guided mode 54 traveling therein.

In an example, the surface roughness $\sigma_{24}$ of surface 24s of WG elements 24E is small enough to enable light-extraction matrix 30 to have a thickness D30 of 0.5 μm or less to enable efficient mode coupling between upper and lower waveguide structure 15 and 27.

The Formation of Light-extraction Waveguide

In an example, light-extraction waveguide 24, including WG elements 24E, comprises an agglomerated coating, such as formed by nanoparticles of titania with a binder and/or a dispersant to define a rutile titania agglomerated nanoparticle coating. Other materials include titania, zirconia, alumina, tin oxide, zinc oxide, cerium oxide, as well as mixtures of these materials with silica, and combinations of these materials. The binder can be a surfactant (typically <1 wt % or <0.05 wt %) and may be non-ionic and non-reactive and should not affect the charge of the inorganic oxide nanoparticles. The binder may also be selected to provide good dispersant property to the nanoparticle solution and may lower the surface tension of the aqueous nanoparticle solution (~34 dyne/cm at 25° C.) providing a dip-coatable solution with uniformity. For example, non-ionic surfactants selected from surfactants similar to Tergitol™, which is a non-ionic surfactant available from The Dow Chemical Company. Suitable binders also include, for example, surfactants similar to Pluronics P123®, which is a difunctional block copolymer surfactant that terminates in primary hydroxyl groups, and is available from BASF Corporation.

Methods to produce the WG elements 24E include coating methods know in the art that produce a surface with desired properties, wherein the WG element concentration and dispersant concentrations may be varied to provide the necessary concentration of WG elements. Such methods include, but are not limited to, dip coating, spin coating, screen printing, ink jet coating, spraying, vapor or particle deposition, roller coating or roll-to-roll processing, etc.

The material that forms light-extraction matrix 30 can also be considered a binder and a smoothening/planarizing layer, and may have a refractive index substantially similar to the refractive index of the substrate 22. For example, substrate 22 can be glass and the light-extraction material can be provided as a "spin on glass." The light-extraction matrix 30 may be characterized by a relatively high crack resistance (low shrinkage after cure), may have the ability to fill nanoscale gaps, and may generally be thermally stable.

In general, the light-extraction matrix 30 is thermally stable up to approximately 250 to 400° C. in air. Beyond this temperature, the surface of the light-matrix material oxidizes, and at a temperature of greater than 550° C. can result in cracking. By way of example, light-extraction matrix 30 may be formed from one or more of: partially polymerized polymethylsiloxane (e.g. T-12, 512B, T-11 spin on glass (Honeywell)), poly-dimethyl-siloxane, poly-diphenyl-siloxane, partially polymerized polysilsesquioxane, poly-methyl-silsesquioxane (HardSil™ AM, Gelest Chemicals), and poly-phenyl-silsequioxane, poly-methyl-phenyl silsesquioxane (HardSil™ AP, Gelest).

In example embodiment, light-extraction waveguide 24 is formed from a zircona coating that define WG elements 24E. The structural morphology of light-extraction waveguide 24 enables light extraction due to one or more light-redirecting features that include the effective refractive index and variations thereof, the thickness $TH_b$ and variations thereof, volumetric scattering and surface scattering defined by the surface roughness of surface 24s. In an example, the RMS surface roughness $\sigma_{24}$ of surface 24s has a correlation length $CL_{24}$ in the range from 0.5 µm to 5 µm. In an example, the RMS surface roughness $\sigma_{24}$ of surface 24s is less than 50 nm to enable the use of a light-extraction matrix 30 having a thickness of D30<0.5 µm (in the case for WG elements 24E) or DX<0.5 µm (in the case where light-extraction waveguide 24 is continuous).

In an example where a zirconia agglomerated nanoparticle coating is used to define light-extraction waveguide 24 (including a light-extraction waveguide defined by WG elements 24E), the coating is formed by tape casting, slot coating or dip coating a tetragonal zirconia nanoparticles (3YSZ, 3 mol % yttria stabilized zirconia) dispersant binder solvent formulation and thermally treating <800° C. to remove the polymer binder and dispersants.

Tetragonal zirconia nanoparticles (3YSZ, 3 mol % yttria-stabilized zirconia) in this formulation have a primary particle size of about 50 nm and are composed of very small (e.g., 20 nm) crystallites. The thickness and the surface roughness of WG elements 24E can be varied by changing the dispersion characteristics and coating parameters. The binders are then burnt off by heating the sample to a temperature in the range from than 350° C. to 700° C. and then heating below 800° C. for removal of the polymer to create a porous zirconia layer of thickness ≤0.5 µm or ≤2 µm or ≤5 µm or ≤10 µm that defines the light-extraction waveguide 24.

Thus, in an example, zirconia is deposited onto the upper surface 23 of substrate 22 and the polymer dispersants and solvents used to form the dispersion are thermally removed by a thermal cycle. This thermal step leaves voids in the structure with the removal of polymer that define gaps 35, which are either filled with the material of light-extraction matrix 30 or remain unfilled.

The refractive index of zirconia is approximately 2.2, depending on wavelength of the propagating light. This refractive index enables a good match of the waveguiding parameters of the upper waveguide structure 15 with that of the lower waveguide structure 27, i.e., the guided modes 50 of the upper waveguide structure have substantially the same guided modes 54 as the zirconia light-extraction waveguide 24. The body 24b of zirconia aggregate light-extraction waveguide 24 has the aforementioned voids 24v that scatter light carried in the guided modes 54. Since the dimensions of these voids 24v are less than the wavelength of the propagating visible-wavelength light, the light is scattered at wide angles, which enables the efficient extraction of extracted light 60.

Surface Roughness of Light-extraction Matrix

Figure 2B:
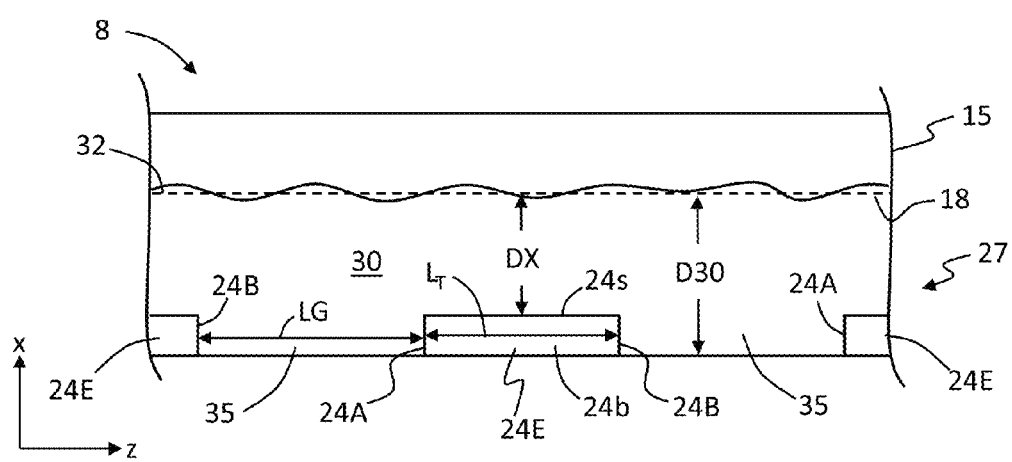
FIG. 2B is similar to FIG. 1B and shows the waveguide elements of the light-extraction waveguide within the light-extraction matrix.
Figure 4A:
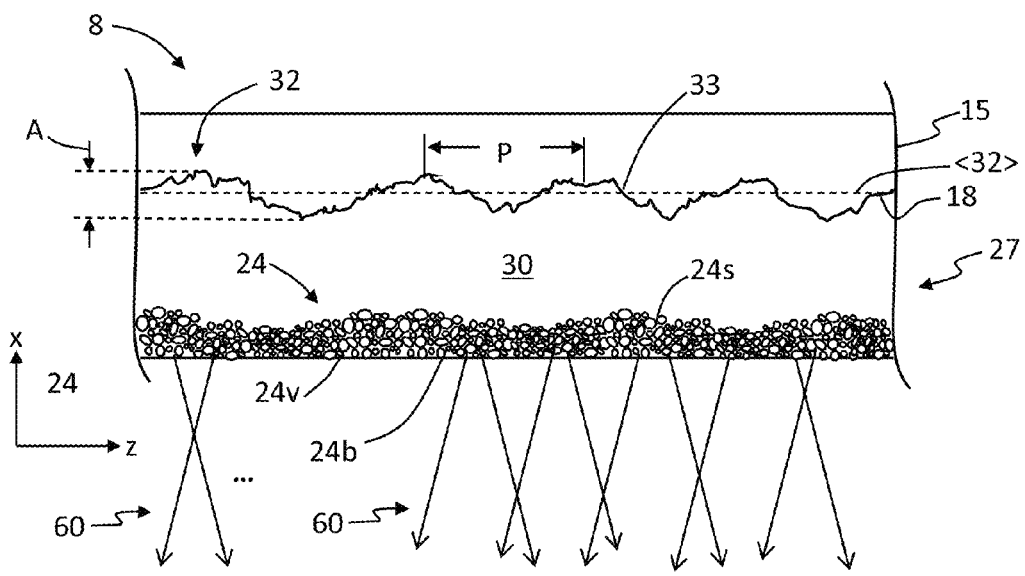
FIG. 4A is a close-up view similar to FIG. 1B, but shows the light-extraction waveguide as being defined by an agglomerated nanoparticle coating having a varying thickness, and showing the upper surface of the light-extraction matrix as including a periodic component to the surface roughness.
Figure 4B:
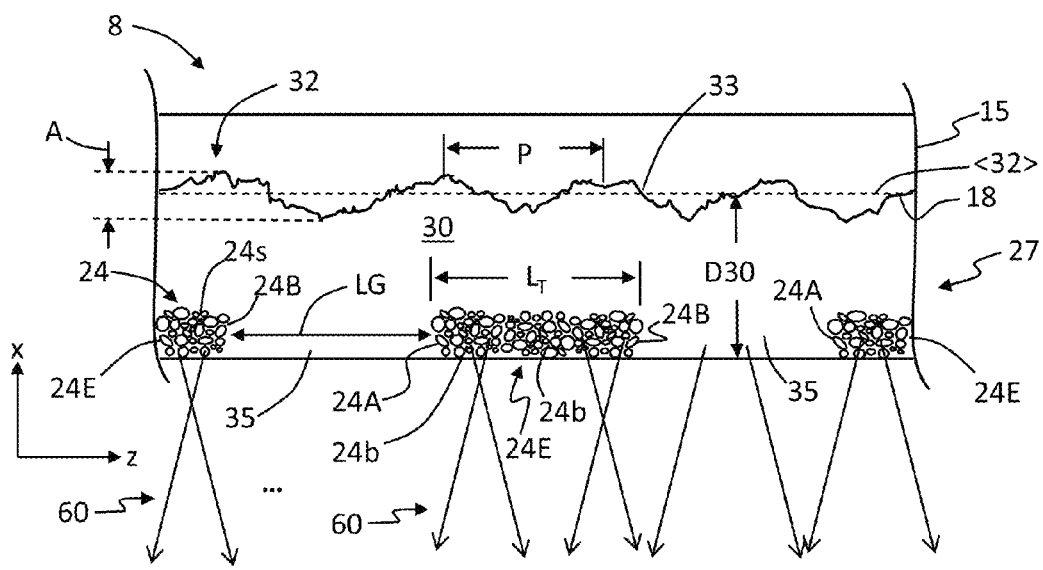
FIG. 4B is similar to FIG. 2B and FIG. 4A, and shows the light-extraction waveguide as having discrete waveguide elements formed as an agglomerated nanoparticle coating.

FIGS. 4A and 4B are close-up views similar to FIGS. 2A and 2B, and show embodiments where the light-extraction waveguide 24 has a continuous structure (FIG. 4A) and where the light-extraction waveguide 24 has discrete WG elements 24E (FIG. 4B).

The continuous light-extraction waveguide 24 of FIG. 4A and the discrete light-extraction waveguide that includes WG elements 24E are shown as formed by agglomerated nanoparticle coatings that define rough upper surface 24s. FIGS. 4A and 4B also show the upper surface 32 of light-extraction matrix 30 as including a periodic component to the surface roughness 33. The average position of upper surface 32 is denoted <32>.

The surface roughness 33 at the upper surface 32 of light-extraction matrix 30 represents a perturbation that strongly interacts with the higher-order modes of the guided modes 50 supported by the upper waveguide structure 15 to provide enhanced light extraction, i.e., more extracted light 60 is obtained than in the absence of the surface roughness. The surface roughness 33 serves to facilitate mode coupling from the lower-order modes of modes 50 of upper waveguide structure 15 to the higher-order modes, which are more easily coupled from upper waveguide structure 15 to the lower waveguide structure 27. This enables the efficient flow or diffusion of trapped light from the OLED device 8.

As noted above, in an example, the rough upper surface 24s of light-extraction waveguide 24 is sufficiently rough to cause scattering of the guided modes 54 that travel therein, while also allowing for light-extraction matrix 30 to have a thickness DX or D30<1 µm or even DX or D30<0.5 µm. In addition, when an agglomerated nanoparticle coating that defines the body 24b of light-extraction waveguide 24, the aforementioned voids 24v defined by the agglomerated nanoparticle coating give rise to the aforementioned volumetric scattering of the guided modes 54, thereby leading to enhanced light extraction of light 60 from OLED device 8.

Figure 5A:
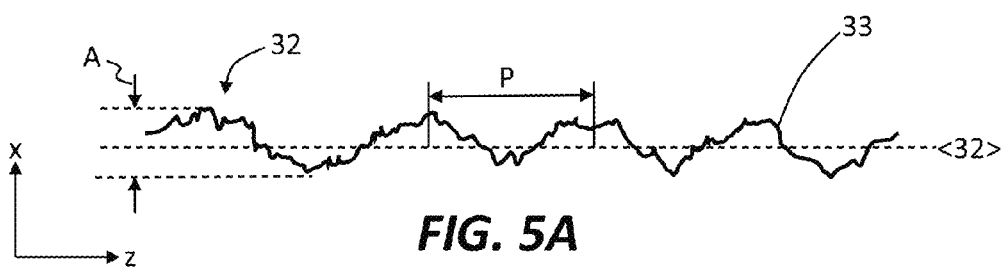
FIG. 5A is a close-up schematic view of the upper surface of the light-extraction matrix showing the rough upper surface with its periodic and random components.
Figure 5B:
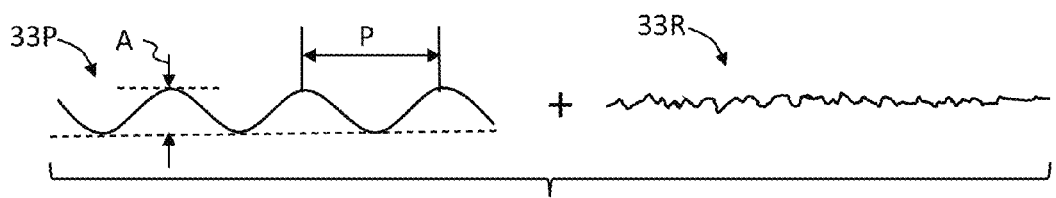
FIG. 5B is a schematic diagram that illustrates how the surface roughness of the upper surface of the light-extraction matrix have a period component and a random component that add together.

FIG. 5A is a close-up view of upper surface 32 of the light-extraction matrix 30 and the surface roughness 33. Surface roughness 33 has a periodic component 33P and a random component 33R, as schematically illustrated in FIG. 5B. The surface roughness 33 can be characterized by a surface height function $h(z)=h_P(z)+h_R(z)$, where $h_P(z)$ is a periodic component and $h_R(z)$ is a random component. The periodic component $h_P(z)$ is defined by a peak-to-valley amplitude A and a period P. The random component characterized by $h_R(z)$ having a random or distribution (e.g., Gaussian) that has a root-mean-square (RMS) surface roughness $\sigma_{33}$.

In an example, the period P of the surface roughness 33 as defined by the periodic component is defined by the range 0.5 µm≤P≤2 µm. Also in an example, the amplitude A is about 5% to 10% of the thickness D15 of upper waveguide structure 15, so that in one example the amplitude A is defined by the range $(0.05) \cdot D15 \leq A \leq (0.1) \cdot D15$. In one example, the amplitude A is in the range 20 nm≤A≤60 nm, while in another example the amplitude A is in the range 25 nm≤A≤50 nm. In an example where the light-extraction waveguide includes WG elements 24E, the period P is less than the length $L_T$ of the WG elements.

If the RMS surface roughness $\sigma_{33}$ is too large, the guided modes 50 will be coupled onto the lossy surface plasmon mode and not result in enhanced light extraction. If the RMS surface roughness $\sigma_{33}$ is too small, there will be insufficient coupling of the guided modes 50 of the upper waveguide structure 15 into the guided modes 54 of the WG elements 24E to enhance light extraction. In an example, the RMS surface roughness $\sigma_{33}$ is in the range 5 nm$\leq\sigma_{33}\leq$25 nm, while in another example, the RMS surface roughness is in the range 7 nm$\leq\sigma_{33}\leq$15 nm.

Another way to ascertain desired parameters for surface 32 of light-extraction matrix 30 is to examine the mode coupling that occurs between upper waveguide structure 15 and light-extraction waveguide 24, where surface 32 resides between these two waveguide structures.

The mode coupling, $C_{i,j}$, between two modes i and j can be well approximated with the following expression:

$$C_{i,j} = \int \psi_i \psi_j \delta n^2 (h(z)/a) dz \qquad (1)$$

where $\delta n^2$ represents the refractive index difference between light-extraction matrix 30 and the adjacent layers and a is a normalizing constant. The i and j modes are orthogonal, but the variation in the surface height h(z) provides for a phase-matching condition whereby guided light can couple among the guided modes, including into the highly attenuating surface plasmon mode. An example OLED device 8 is configured so that upper waveguide structure 15 supports five guided modes 50, represented by $\psi$, in equation (1), above. The exact number of guided modes 50 depends on the optical wavelength, the thickness of layers 12, 14 and 16 of upper waveguide structure 15, as well as their respective refractive indices.

The optical propagation constants $\beta$ of the guided modes 50, as well as the wavefunctions, can be calculated methods known in the art (see, e.g., Yeh, "Optical Waves in Layered Media," published by John Wiley & Sons, Inc.). The surface frequency parameters required to cause this coupling can be estimated by taking the difference $\Delta\beta$ between the propagation constants $\beta$ of the i and j modes. The difference $\Delta\beta$ has the units of inverse length.

Using the propagation constants $\beta$, the surface frequencies f are on the order of 0.5 to 2 $\mu m^{-1}$. These surface frequencies f are therefore generally desirable. Certain of these surface frequencies f will also cause coupling to the surface plasmon polaritons. On the other hand, calculations using equation (1) show that the mode coupling between the guided modes 50 and 54 that result in enhanced light extraction values occur at a higher rate that the coupling to the surface plasmon polaritons.

The light-absorbing surface plasmon polaritons only occur when surface 32 is a rough surface. The phase-matching condition for mode coupling to surface plasmon polaritons indicates that the surface frequency f needs to be greater than 2 $\mu m^{-1}$, so that in an example embodiment, the surface frequency f for the rough surface 33 of surface 32 is less than 2 $\mu m^{-1}$. On the other hand, it has been determined through simulation and experiments that surface frequencies f less than 0.5 $\mu m^{-1}$ can also result in coupling to surface plasmon polaritons, but the polaritons are low energy and therefore do not carry substantial amounts of light.

Figure 6:
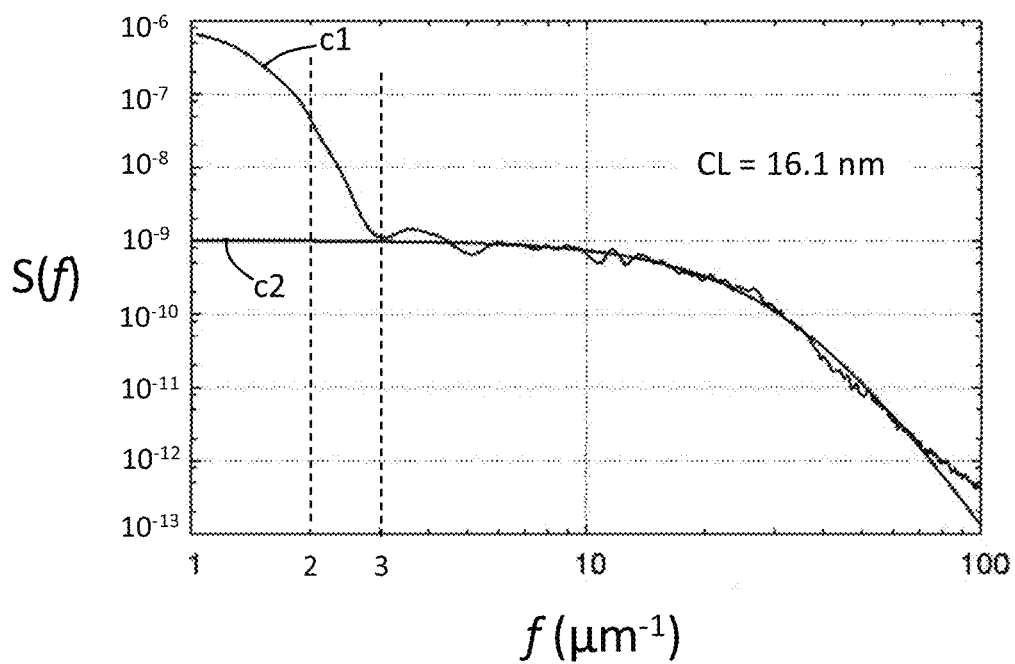
FIG. 6 is a plot of the power spectral density S(f) (relative units) versus spatial frequency f (µm$^{-1}$) for an example surface of the light-extraction matrix.

FIG. 6 is a plot of the power spectral density S(f) (relative units) versus spatial frequency f ($\mu m^{-1}$) for an example rough surface 32 of light-extraction matrix 30. The plot includes the actual data in curve c1 based on a 2 $\mu m$ scan of the surface, and a fit to the measured data in curve c2. The plot shows a large concentration of spatial frequencies f below the f=2 $\mu m^{-1}$ frequency, beyond which undesirable mode coupling to the surface plasmon polaritons becomes substantial. The plot also shows the highest concentration of spatial frequencies at f=1 $\mu m^{-1}$, which is very desirable, with a decrease of about one order of magnitude between the number of spatial frequency components at 1 $\mu m^{-1}$ and 2 $\mu m^{-1}$ and with a decrease of about three orders of magnitude between 1 $\mu m^{-1}$ and 3 $\mu m^{-1}$.

In an example, surface 32 has a surface roughness wherein the spatial frequency f is in the range f$\leq$2 $\mu m^{-1}$ or in the range 0.5 $\mu m^{-1}\leq$f$\leq$2 $\mu m^{-1}$, and the RMS surface roughness $\sigma_{33}$ in the range $\sigma_{33}\leq$40 nm or in the aforementioned range of 5 nm$\leq\sigma_{33}\leq$20 nm. Thus, in an example embodiment, surface 32 has a surface roughness wherein most of the spatial frequencies of the surface satisfy the condition f$\leq$2 $\mu m^{-1}$ or alternatively 0.5 $\mu m^{-1}\leq$f$\leq$2 $\mu m^{-1}$, and in another example, the portion (e.g., percentage) of spatial frequencies f smaller than 2 $\mu m^{-1}$ is more than 90%.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. An organic light emitting diode (OLED) device having enhanced light extraction, comprising:
    an upper waveguide structure that supports first guided modes and comprising a cathode, an anode with a lower surface, and an organic light-emitting semiconductor material interposed between the cathode and the anode;
    a lower waveguide structure interfaced with the upper waveguide structure and that supports second guided modes substantially matched to the first guided modes, the lower waveguide structure comprising a substrate having an upper surface, a light-extraction waveguide distributed over the upper surface of the substrate and having an upper surface with a root-means square (RMS) surface roughness of <50 nm and a correlation length in the range from 0.5 $\mu m$ to 5 $\mu m$ and that is interfaced with a bottom surface of a light-extraction matrix distributed over the upper surface of the light-extraction waveguide;
    wherein the light-extraction matrix includes a rough upper surface that interfaces with the lower surface of the anode and that facilitates mode coupling from the first guided modes of the upper waveguide structure to the second guided modes of the lower waveguide structure while substantially avoiding coupling from the first guided modes to surface plasmon polaritons, the rough upper surface having a periodic component with a peak-to-valley amplitude A and a period P, wherein 0.5$\mu$m$\leq$P$\leq$2$\mu$m, and wherein 20nm$\leq$A$\leq$60nm, and a random component defined by a root-mean-square (RMS) surface roughness $\sigma_{33}$, wherein 5nm$\leq\sigma_{33}\leq$25nm; and
    wherein light traveling as second guided modes in the light-extraction waveguide of the lower waveguide structure is redirected to exit the lower surface of the substrate by light-redirecting features of the lower waveguide structure.

2. The OLED device according to claim 1, wherein the light-extraction waveguide includes discrete waveguide elements.

3. The OLED device according to claim 1, wherein no greater than 50% of light carried in the first guided modes is coupled into the surface plasmon polaritons.

4. The OLED device according to claim 1, wherein the light-extraction waveguide is formed from an agglomerated nanoparticle coating.

5. The OLED device according to claim 4, wherein the agglomerated nanoparticle coating includes at least one of: titania rutile, anatase, zirconia, yttria-stabilized zirconia, alumina, tin oxide, cerium oxide, zinc oxide, and mixtures of these with silica.

6. The OLED device according to claim 1, wherein the light-extraction waveguide includes continuous waveguide elements that have light-redirecting features.

7. The OLED device according to claim 1, wherein the light-extraction waveguide includes light-redirecting features in the form of surface roughness and internal voids.

8. An organic light emitting diode (OLED) device having enhanced light extraction, comprising;
   an upper waveguide structure having an organic layer and configured to support first guided modes; and
   a lower waveguide structure with a light-extraction waveguide configured to support second guided modes substantially matched to the first guided modes, wherein the light-extraction waveguide has an upper surface with a surface roughness of <50 nm and a correlation length in the range from 0.5μm to 5μm and that is interfaced with a bottom surface of a light-extraction matrix having a rough upper surface with a periodic component having a peak-to-valley amplitude A and a period P, wherein $0.5\mu m \leq P \leq 2\mu m$, and wherein $20nm \leq A \leq 60nm$, and also having a random component defined by a root-mean-square (RMS) surface roughness $\sigma_{33}$, wherein $5nm \leq \sigma_{33} \leq 25nm$, the light-extraction matrix configured to facilitate mode coupling from the first guided modes to the second guide modes while substantially avoiding coupling the first guided modes to surface plasmon polaritons; and
   wherein the light-extracting waveguide includes light-redirecting features that redirects light traveling in the light-extracting waveguide as the second guided modes to exit the lower waveguide structure.

9. The OLED device of claim 8, wherein the light-extraction waveguide includes discrete waveguide elements.

10. The OLED device according to claim 8, wherein the light-extraction waveguide is formed from an agglomerated nanoparticle coating.

11. The OLED device according to claim 10, wherein the agglomerated nanoparticle coating includes at least one of: titania rutile, anatase, zirconia, yttria-stabilized zirconia, alumina, tin oxide, cerium oxide, zinc oxide, and mixtures of these with silica.

12. A method of extracting light from an organic light-emitting diode (OLED) device in an enhanced manner, comprising:
   guiding light emitted by a layer of organic material in first guided modes of an upper waveguide structure formed by the layer of organic material interposed between an anode and a cathode;
   optically coupling the light in the first guided modes into light that travels in second guided modes of a lower waveguide structure having a lower surface and that includes a light-extraction waveguide having an upper surface with a surface roughness of <50nm and a correlation length in the range from 0.5μm to 5μm and that is interfaced with a bottom surface of a light-extraction matrix having a first rough surface that interfaces with the anode of the upper waveguide, wherein the rough surface has a periodic component and a random component, with the periodic component having a peak-to-valley amplitude A and period P, wherein $0.5\mu m \leq P \leq 2\mu m$ and $20nm \leq A \leq 60nm$, and wherein the random component is defined by a root-mean-square (RMS) surface roughness $\sigma_{33}$, wherein $5nm \leq \sigma_{33} \leq 25nm$ to enhance the coupling of the light in the first guided modes into the light traveling in the second guided modes within the light-extraction waveguide while substantially avoiding coupling the first guided modes to surface plasmon polaritons; and
   redirecting the light traveling in the light-extraction waveguide out of the lower surface of the lower waveguide structure.

13. The method according to claim 12, wherein the redirection of the light traveling in the light-extraction waveguide in the second guided modes is caused by scattering from one or more light-redirecting features.

14. The method according to claim 13, wherein the one or more light-directing features includes voids within a body of the light-extraction waveguide and a rough surface of the light-extraction waveguide.

15. The method according to claim 14, wherein the light-extraction waveguide includes discrete waveguide elements.

16. The method according to claim 12, wherein no greater than 50% of the light of the first guided modes is coupled into the surface plasmon polaritons supported at the interface between the rough surface of the light-extraction matrix and the anode.

17. The method according to claim 12, wherein the light-extraction waveguide is formed from an agglomerated nanoparticle coating that includes at least one of: titania rutile, anatase, zirconia, yttria-stabilized zirconia, alumina, tin oxide, cerium oxide, zinc oxide, and mixtures of these with silica.

* * * * *

UNITED STATES PATENT AND TRADEMARK OFFICE
CERTIFICATE OF CORRECTION

PATENT NO. : 9,933,587 B2  
APPLICATION NO. : 14/920169  
DATED : April 3, 2018  
INVENTOR(S) : Robert Adam Modavis et al.

Page 1 of 1

It is certified that error appears in the above-identified patent and that said Letters Patent is hereby corrected as shown below:

In the Claims

In Column 14, Line 32, Claim 14, delete "light-directing" and insert -- light-redirecting --, therefor.

Signed and Sealed this  
Nineteenth Day of May, 2020

Andrei Iancu  
*Director of the United States Patent and Trademark Office*